United States Patent [19]

Nishioka et al.

[11] Patent Number: 5,490,118
[45] Date of Patent: Feb. 6, 1996

[54] MULTIPLE POWER SOURCE MEMORY CONTROL CIRCUIT FOR MEMORY DEVICES

[75] Inventors: Koichi Nishioka; Kyoichi Shimakawa; Hidenobu Gochi, all of Itami, Japan

[73] Assignee: Mitsubishi Denki Kabushiki Kaisha, Tokyo, Japan

[21] Appl. No.: 67,957

[22] Filed: May 27, 1993

(Under 37 CFR 1.47)

[30] Foreign Application Priority Data

Jun. 1, 1992 [JP] Japan .................................. 4-140182

[51] Int. Cl.⁶ .................................................. G11C 5/14
[52] U.S. Cl. .......................... 365/229; 365/227; 365/226; 365/230.03; 365/52
[58] Field of Search ..................................... 365/226, 227, 365/228, 229, 52, 230.03; 307/66

[56] References Cited

U.S. PATENT DOCUMENTS

| | | | |
|---|---|---|---|
| 4,388,706 | 6/1983 | Butler | 365/226 |
| 4,587,640 | 5/1986 | Saitoh | 365/229 |
| 5,016,223 | 5/1991 | Kimura et al. | 365/226 |
| 5,212,664 | 5/1993 | Shinohara | 365/229 |
| 5,309,396 | 5/1994 | Kimura | 365/229 |

FOREIGN PATENT DOCUMENTS 2306498  12/1990  European Pat. Off. .

OTHER PUBLICATIONS

"Interfacing considerations for Mitsubishi memory cards"; 2407 Microprocessors and Microsystems; 14(1990) Sep., No. 7, pp. 479–482, London, GB.

*Primary Examiner*—Joseph A. Popek
*Assistant Examiner*—Vu Le
*Attorney, Agent, or Firm*—Leydig, Voit & Mayer

[57] ABSTRACT

A memory control circuit for controlling a memory chip enable signal without unnecessary power consumption in a non-volatile memory chip during the backup state. When a backup signal ($\overline{BUP}$) shows that the card is in a backup state, all of the memory chip enable signal output lines are set to a high-impedance state by controlling a backup time control means inserted therein, and pull-up resistors 20 are connected to the memory chip enable signal output lines 8 connected to the volatile memory chip 2 for setting them to a "H" level, and an A power source 5 without backup is connected to the memory chip enable signal output lines 8 connected to the non-volatile memory chip 3 through a pull-up resistor 30, thereby preventing unnecessary current from flowing.

4 Claims, 10 Drawing Sheets

MULTIPLE POWER SOURCE MEMORY CONTROL CIRCUIT FOR MEMORY DEVICES

BACKGROUND OF THE INVENTION

1. Field of the Invention

The present invention relates to a memory control circuit in a memory card for driving and controlling memory chips incorporated therein.

2. Detailed Description of the Related Art

Figure 8:
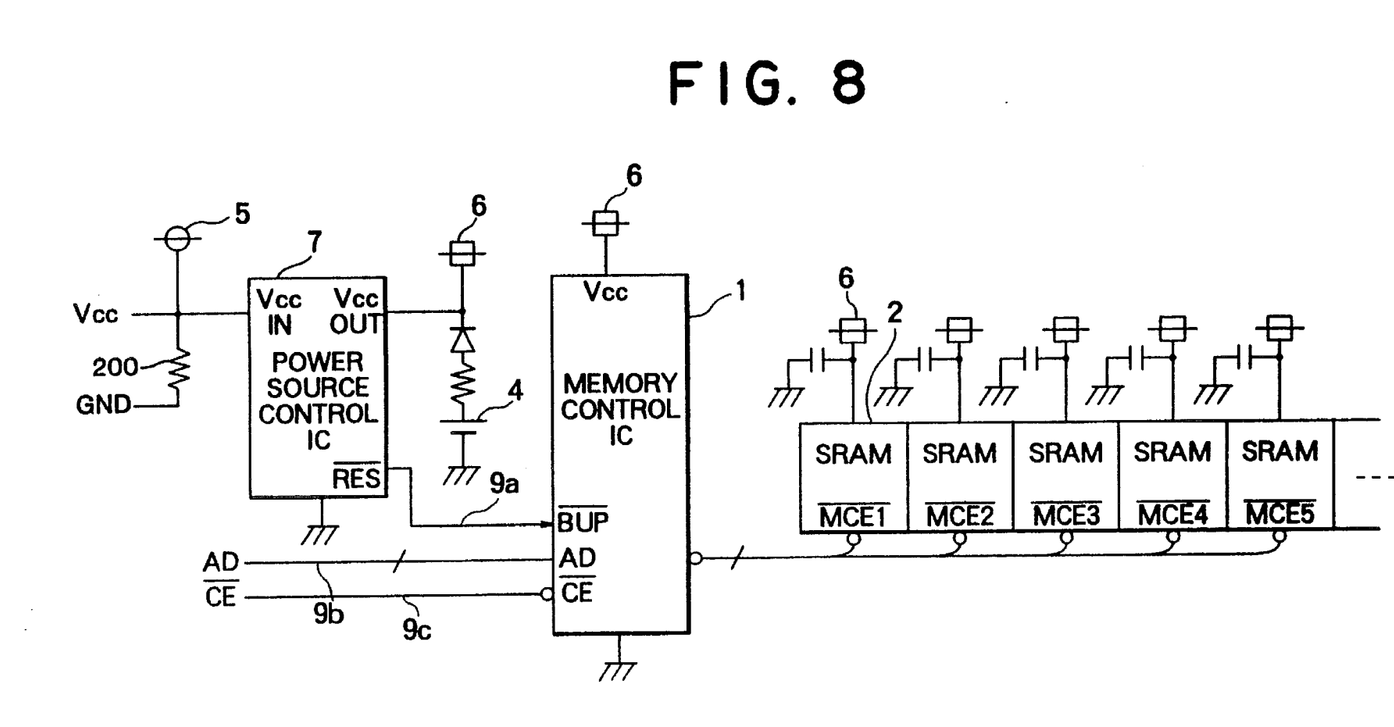
FIG. 8 is a schematic block diagram showing a relationship between a memory control circuit and a memory chip in a conventional volatile memory card.
Figure 9:
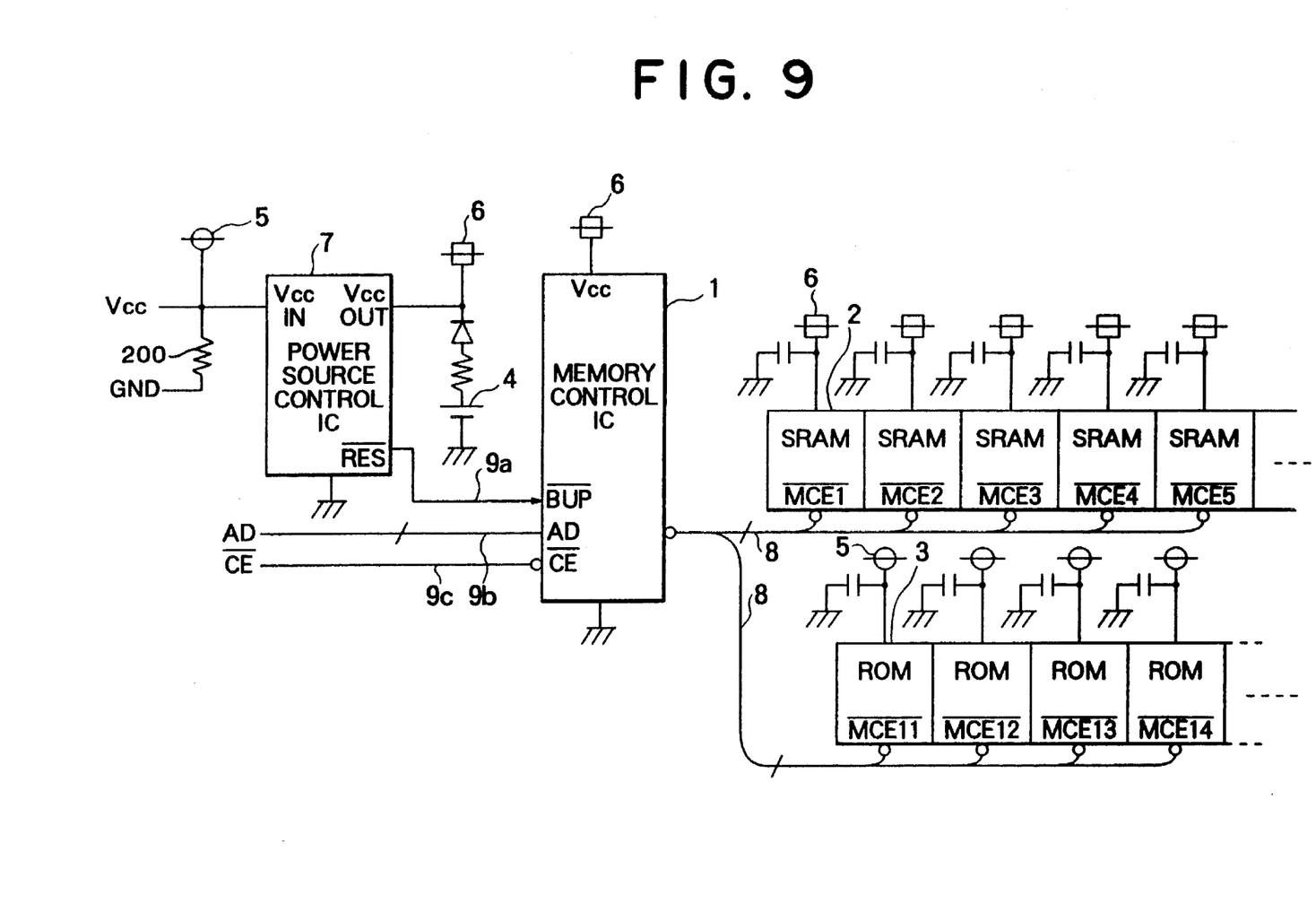
FIG. 9 is a block diagram schematically showing a relationship between a memory control circuit and a memory chip in a conventional hybrid memory card.

FIGS. 8 and 9 of the accompanying drawings are block diagrams schematically showing a relationship between a memory control circuit and memory chips incorporated in a conventional memory card, wherein FIG. 8 relates to an SRAM (Static Random Access Memory) card (volatile memory card) incorporating SRAM, while FIG. 9 relates to a MIX card (hybrid memory card) incorporating SRAM and non-volatile ROM (Read Only Memory) in a mixed state. In both FIGS., the numerals designate respectively: 1, a memory control circuit; 2, an SRAM chip; 3, a ROM chip; 4, a data backup built-in battery; 5, a power source without backup indicated by a circle (hereinafter referred to as A power source); 6, a power source with backup indicated by a square (hereinafter referred to as B power source); 7, a power source control IC having a one mega ohm resistor 200 connected between Vcc and ground; 8, a memory chip enable signal bus which is composed of a plurality of memory chip enable signal output lines; 9a, a backup signal line; 9b, an address bus; and 9c, a chip enable signal line.

The A power source 5 receives power outside of the card e.g. from a terminal machine (not shown) when the card is connected thereto. The B power source 6, meanwhile, has a backup for receiving power supply from the built-in-battery 4 for maintaining data in the volatile memory even when the card is not in use. The memory control circuit (hereinafter referred to as memory control IC) 1 and the SRAM chips 2 are connected to the B power source 6, and the ROM chips not needing any backup shown in FIG. 9 are connected to the A power source 5. The power source control circuit 7 (hereinafter referred to as power source control IC) switches between both power sources 5 and 6, and generates a backup signal ($\overline{BUP}$) indicating the backup state when there is no power supply outside of the card.

The memory control IC 1 receives an address signal (AD) and a chip enable signal ($\overline{CE}$) from e.g. the terminal machine, and a backup signal ($\overline{BUP}$) from the power source control IC 7, and selectively outputs memory chip enable signals to the SRAM chips 2 and the ROM chips 3 in accordance with these input signals. The SRAM chips 2 and the ROM chips 3 have memory chip enable signal input terminals ($\overline{MCE1}$, $\overline{MCE2}$, . . . ) to which the memory chip enable signals are input. The chips 2 and 3 are set to the states of being capable of reading or of reading/writing when the memory chip enable signal is in "L" level condition. Several other kinds of control signals such as write enable signal etc. are also input to the memory control IC 1, but are omitted to be described and illustrated here for simplification, thereby showing only the signals essentially relating to the present invention.

Figure 10:
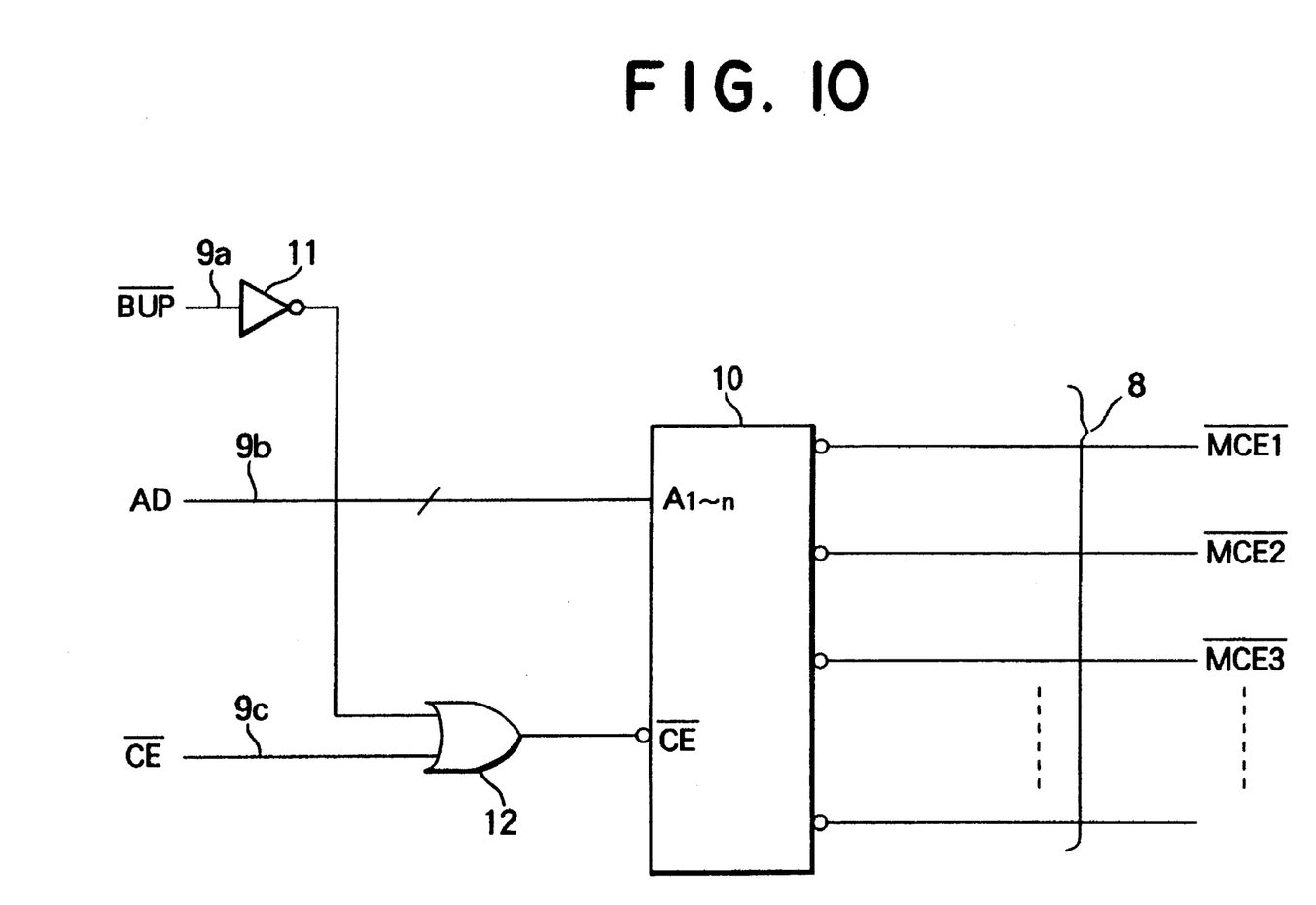
FIG. 10 is a block diagram showing portions for generating memory chip enable signals in the control circuit shown in FIGS. 8 and 9.

FIG. 10 schematically shows a composition of the memory chip enable signal generating section in the memory control IC 1. In FIG. 10, a decoder 10 becomes an enable state when its chip enable terminal ($\overline{CE}$) is in "L" level condition to selectively supply memory chip enable signals of "L" level ($\overline{MCE1}$, $\overline{MCE2}$, . . . ) in accordance with the address signals (AD). Also, the decoder 10 becomes a disable state when the chip enable terminal ($\overline{CE}$) is in an "H" level condition to set all the memory chip enable signals ($\overline{MCE1}$, $\overline{MCE2}$, . . . ) to an "H" level. The backup signal ($\overline{BUP}$) from the power source control IC 7 is in an "L" level condition during the backup state and inverted in an inverter 11 to be then supplied to an input terminal of an OR gate 12 so as to become a gate signal for a chip enable signal ($\overline{CE}$) input to the other Input terminal of the OR gate. An output terminal of the OR gate 12 is connected to a chip enable terminal ($\overline{CE}$) of the decoder 10.

Therefore, in both cases of FIGS. 8 and 9, the decoder 10 is disabled during the backup state, such that the "H" level memory chip enable signals ($\overline{MCE}$) are supplied to all the SRAM chips 2 and the ROM chips 3. As a result, the chips 2 and 3 are disabled, and the SRAM chips 2 coupled to the B power source 6 are in the backup state-to maintain the stored data.

As mentioned above, in the conventional memory control circuit for the memory card, the memory chip enable signals of "H" level have been supplied to all the coupled memory chips for disabling them in the backup state. Therefore, in the case of the hybrid memory card, the "H" level memory chip enable signals were supplied even to those ROM chips not requiring any backup. This means that unnecessarily excessive currents flow through the ROM chips to cause unnecessary power consumption.

SUMMARY OF THE INVENTION

It is therefore an object of the present invention to provide a memory control circuit for a memory card which is capable of eliminating unnecessary power consumption by supplying suitable memory chip enable signals to a volatile memory chip and a non-volatile memory chip during the backup state of a hybrid memory card.

It is another object of the present invention to provide a memory control circuit for a hybrid memory card which, in addition to aforementioned characteristics, is capable of being used for both the volatile memory card and a hybrid memory card.

According to a first aspect of the present invention, a memory control circuit for a memory card having an A power source connected to an external power source and a B power source connected to a built-in-battery for memory backup, said memory card being a hybrid memory card including at least one non-volatile memory chip connected to the A power source and at least one volatile memory chip connected to said B power source mounted thereon, said memory control circuit comprising: a decoder having, at the input side, an address signal bus, a chip enable signal line for controlling the driving of said decoder, and a backup signal indicating a data backup state of the memory card, and at the output side, a plurality of memory chip enable signal output lines connected respectively to the memory chips, and selectively generating memory chip enable signals for enabling the memory chips to said plurality of memory chip enable signal output lines in accordance with the address signal during the enable state due to control of the chip enable signal; a backup time control means for compulsorily disabling the chip enable signal and turning all the memory chip enable signal output lines of said decoder into a high-impedance state, when the backup signal indicates a backup state; pull-up resistors connecting the memory chip enable signal output lines to one of the B power supply and the non-backed-up A power supply respectively, for disabling the memory chip enable signal output lines for the volatile memory chips and setting the memory chip enable signal output lines for the non-volatile memory chips to such a state as preventing the current from flowing through the non-volatile memory chips, when the memory chip enable signal output lines are in high-impedance state.

According to a second aspect of the present invention, a memory control circuit including an A power source connected to an external power source and a B power source connected to a built-in-battery for memory backup, said memory control circuit capable of being used for both a volatile memory card having at least one volatile memory chip connected to the B power source and a hybrid memory card having at least one non-volatile memory chip connected to the A power source and at least one volatile memory chip connected to the B power source, said memory control circuit comprising: a decoder having, at the input side, an address signal bus, a chip enable signal line for controlling the driving of said decoder, and a backup signal line indicating a data backup state of the memory card, and at the output side, a plurality of memory chip enable signal output lines connected respectively to the memory chips, said decoder selectively generating memory chip enable signals for enabling the memory chips to said plurality of memory chip enable signal output lines in accordance with the address signal during the enable state, and generating signals for disabling the volatile memory chip to all the memory chip enable signal output lines during the disabled state; a switching signal line for indicating whether the memory card is a volatile memory card or a non-volatile memory card; a backup time control means for compulsorily disabling the chip enable signal when the backup signal indicates a backup state, and directly supplying the signals on the memory chip enable signal output lines of said decoder to the memory chips when the switching signal indicates volatile memory card use, while turning all the memory chip enable signal output lines of said decoder into a high-impedance state when the switching signal indicates hybrid memory card use; pull-up resistors connecting the memory chip enable signal output lines to one of the B power supply and the non-backed-up A power supply respectively, for disabling the memory chip enable signal output lines to the volatile memory chips and setting the memory chip enable signal output lines to the non-volatile memory chips to such a state as preventing the current from flowing through the non-volatile memory chips, when the memory card is a hybrid memory card and said memory chip enable signal output lines are in high-impedance state.

According to a third aspect of the present invention, a memory control circuit including an A power source connected to an external power source and a B power source connected to a built-in-battery for memory backup, said memory control circuit capable of being used for both a volatile memory card having at least one volatile memory chip connected to the B power source and a hybrid memory card having at least one non-volatile memory chip connected to the A power source and at least one volatile memory chip connected to the B power source, said memory control circuit comprising: a main circuit having, at the input side, a write enable signal line and a backup signal line for indicating that the memory card is in the backup state, and at the output side, a plurality of write enable signal output lines being connected respectively to the memory chips, said main circuit supplying write enabling signals to the write enable signal output lines in accordance with the input write enable signals when the backup signal indicates that the card is in the operating state, while setting at least one of the write enable signal output lines to have a value for write-disabling the memory chip and the remained ones to a high-impedance state when the backup signal indicates a backup state; and pull-up resistors, being connected respectively to the write enable signal output lines which are set to a high-impedance state during the backup state, for connecting the write enable signal output lines to the non-backed-up A power supply.

In the memory control circuit for the hybrid memory card according to the first aspect of this invention, the memory chip enable signal output lines of the decoder are all set to the high-impedance state during the backup state by the backup time control means, and further the volatile memory chips are disabled by the pull-up resistors so as to be put in the data backup state, and the memory chip enable signal output lines of the non-volatile memory chips are coupled to the A power source without backup by the pull-up resistors connected to the non-backed-up power supply for preventing unnecessary current flow.

In the memory control circuit usable for both the volatile memory card and the hybrid memory card according to the second aspect of this invention, the decoder generates signals for disabling the volatile memory chips to all the memory chip enable signal output lines during the backup state. When the switching signal indicates that the card is the hybrid card (i.e. the memory control circuit is being used in the hybrid memory card mode), all the memory chip enable signal output lines are set to the high-impedance state by the backup time control means. When the memory control circuit is used in the hybrid memory card, further, the volatile memory chips are disabled by the pull-up resistor connected to the memory chip enable signal output lines thereof, and the memory chip enable signal output lines of the non-volatile memory chips are connected to the A power source without backup by the pull-up resistors connected to the non-backed-up power supply for preventing unnecessary current flow.

The memory control circuit according to the third aspect of this invention can be used for both the volatile memory card and the hybrid memory card and act to control the write enable signals. There are provided two types of write enable signal output lines for outputting suitable write enable signals such that, in the backup state, the writing operation is prohibited and the stored data is kept in the volatile memory while any unnecessary current is prevented from being consumed in the non-volatile memory chip.

The above and other advantages, features and additional objects of this invention will be manifest to those versed in the art upon making reference to the following detailed description and the accompanying drawings in which a structural embodiment incorporating the principles of this invention is own by way of illustrative example.

DETAILED DESCRIPTION OF THE PREFERRED EMBODIMENTS

Figure 1:
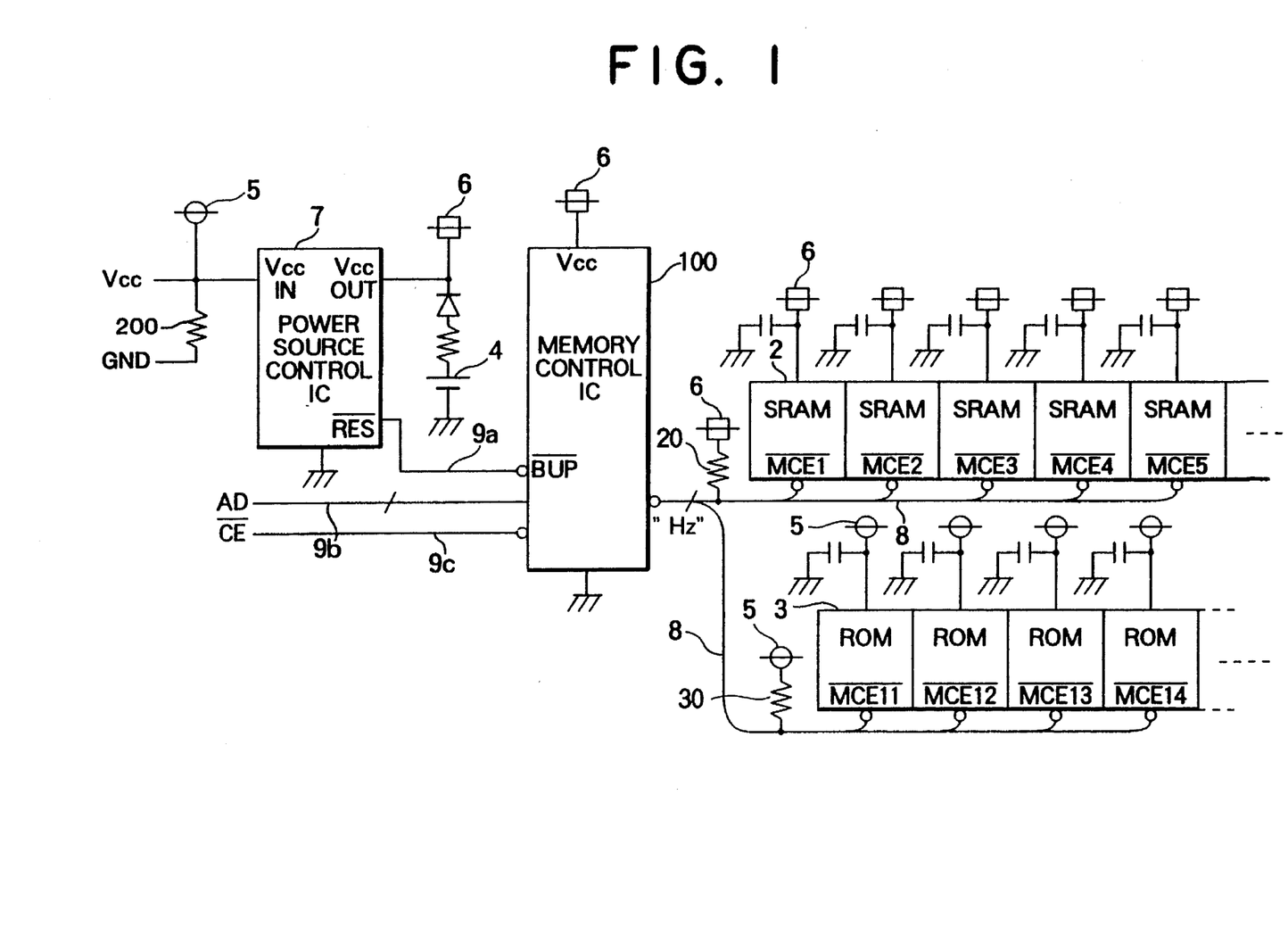
FIG. 1 is a schematic block diagram showing a relationship between a memory control circuit and a memory chip in a hybrid memory card incorporating a memory control circuit for a memory card according to the first aspect of this invention.
Figure 2:
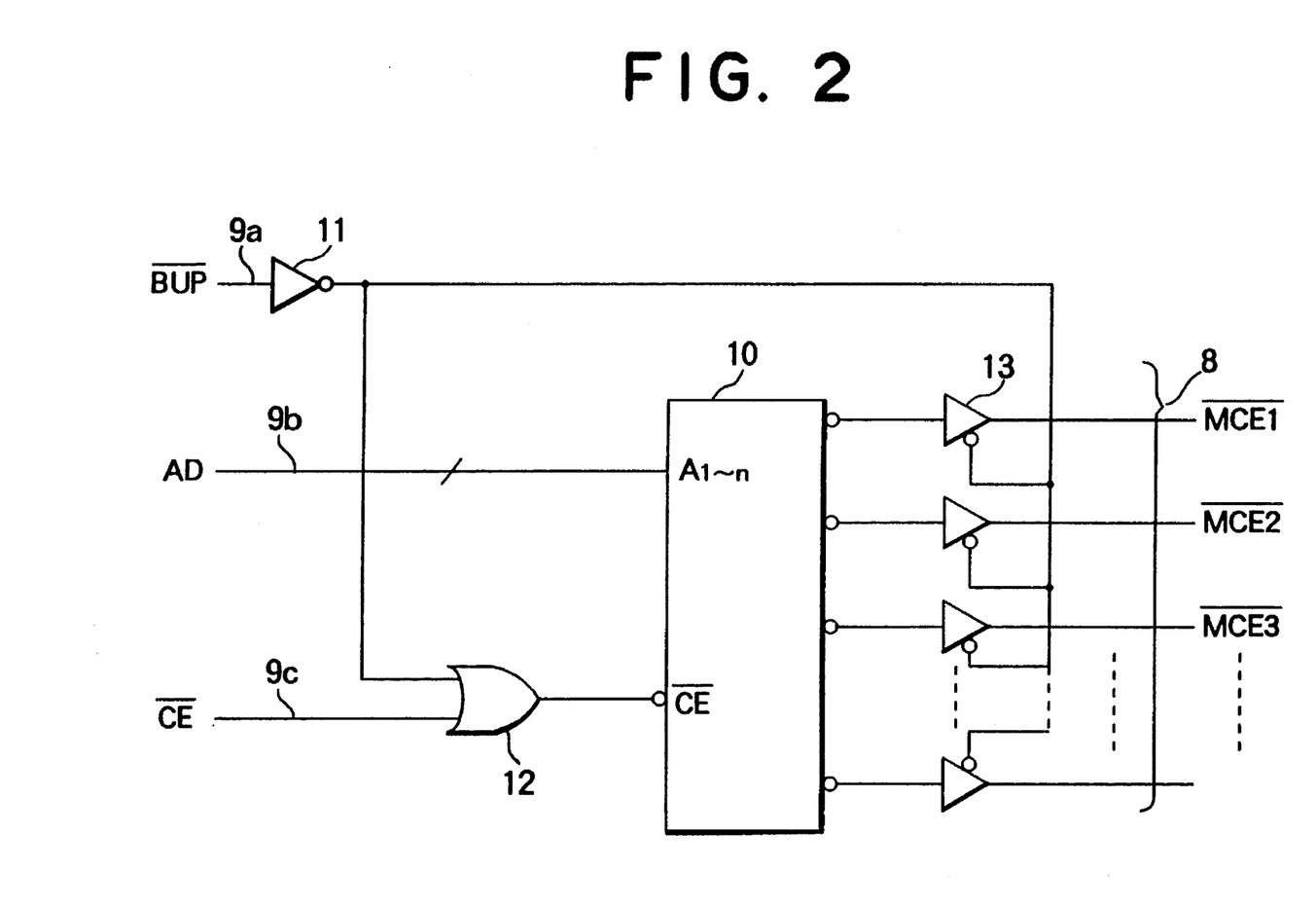
FIG. 2 is a block diagram showing a composition of portions for generating memory chip enable signals in the memory control circuit shown in FIG. 1.

FIGS. 1 and 2 show a memory control circuit for a memory card according to a first embodiment of the present invention, particularly for a hybrid memory card. FIG. 1 is a block diagram schematically showing a relationship between the memory control circuit and memory chips in the hybrid memory card of this embodiment. The same components as in the conventional memory control circuit shown in FIGS. 8 to 10 are designated by the same numerals and are omitted from explanation.

In FIG. 1, a memory control IC (memory control circuit) 100 is for a hybrid memory card on which both volatile memory chips and non-volatile memory chips are mounted. Output lines of a memory chip enable signal bus 8 are extended from the memory control IC to memory chip enable terminals ($\overline{MCE1}$, $\overline{MCE2}$, ... etc.) of SRAM chips 2 and ROM chips 3.

A "B" power source 6 having a backup is connected to the memory chip enable terminals ($\overline{MCE1}$, $\overline{MCE2}$, ... etc.) of the SRAM chips 2 through respective pull-up resistors. These pull-up resistors 20 pull up the memory chip enable signal output lines being in a high-impedance state ("Hz") to an "H" level. Further, an A power source 5 without backup is connected to the memory chip enable signal output lines being connected to the memory chip enable terminals ($\overline{MCE11}$, $\overline{MCE12}$, ... etc.) of the ROM chips 3 through pull-up resistors 30. These pull-up resistors 30 pull-down the memory chip enable signal output lines to a "L" level (or ground level) when they are in the high-impedance state ("Hz") during the backup state. These pull-up resistors 20 and 30 are set to such resistance values that do not disturb the "H" or "L" level state of the memory chip enable signals.

Further, FIG. 2 is a block diagram showing an example of a composition of a section for generating memory chip enable signals of the memory control IC 100 in FIG. 1. A circuit composed of a decoder 10, an inverter 11 and an OR gate 12 is the same as that in the conventional memory control IC shown in FIG. 10 and acts in the same manner. In this embodiment, tri-state buffers 13 are provided on the memory chip enable signal output lines ($\overline{MCE1}$, $\overline{MCE2}$, ... etc.) extending toward the output side of the decoder 10. These tri-state buffers 13 directly output the input signals when their gate terminals are at a "L" level, while when the gate terminals are at a "H" level, their outputs change to the high-impedance state ("Hz" level). Backup signals ($\overline{BUP}$) are connected to the gate terminals of the tri-state buffers through the inverter 11. Accordingly, when the card is not in the backup state, "L" level signals having been inverted in the inverter 11 are supplied to the gate terminals of the tri-state buffers since the backup signals ($\overline{BUP}$) are at a "H" level, such that the output of the decoder 10 is directly supplied to the chips 2 and 3. Meanwhile, when the card is in the backup state, the backup signals ($\overline{BUP}$) turn into "L" level signals such that the inverted "H" level signals are input to the gate terminals of the tri-state buffers 13, the output of which is then switched to high-impedance state ("Hz" level). The inverter 11, the OR gate 12 and the tri-state buffer 13 compose a backup time control means.

The operation of the aforementioned circuit will now be described. When the card is in the operating state and the chip enable terminals ($\overline{CE}$) are at a "L" level, the decoder 10 of the memory control IC 100 shown in FIG. 2 is enabled. Further, since the gate terminals of the tri-state buffers 13 of the memory chip enable signal output lines are at a "L" level, the input signals are directly output. Accordingly, the decoder 10 selectively supplies the memory chip enable signals ($\overline{MCE1}$, $\overline{MCE2}$, ... etc.) being at a "L" level in accordance with the address signals (AD) to enable a particular chip 2 or 3.

On the other hand, when the card is in the backup state, since the backup signal ($\overline{BUP}$) is at a "L" level, the inverted "H" level signals are input to an input terminal of the OR gate 12. As a result, the output of the OR gate 12 is turned into "H" level irrespective of the value of the input chip enable signals ($\overline{CE}$). Accordingly, the decoder 10 becomes disabled to turn all the memory chip enable signals into a "H" level. The tri-state buffers 13 provided on the memory chip enable signal output lines are, however, receiving an "H" level signal at their gate terminals in the backup state. So, all the outputs of the tri-state buffers 13 are put in the high-impedance state ("Hz") (see FIG. 1). Then, "H" level signals are supplied to the memory chip enable terminals ($\overline{MCE1}$, $\overline{MCE2}$, ... etc.) of the SRAM chip 2 by the operation of the pull-up resistors 20 connected to the B power source 6 shown in FIG. 1, and the SRAM chips 2 are disabled to be in the backup state. On the contrary, the memory chip enable terminals ($\overline{MCE11}$, $\overline{MCE12}$, ...) of the ROM chips 3 are turned into "L" level signals by the operation of the pull-up resistors 30 connected to the A power source 5 without backup shown in FIG. 1 so as not to receive a power supply. Namely, since there is no voltage and current supply from the A power source in the backup state, the memory chip enable signal lines connected to the A power source 5 through the pull-up resistors 30 are turned into "L" level signals. As a result, no unnecessary current flows through the ROM chip 3 during the backup state so as to effectively save the power consumption.

Figure 3:
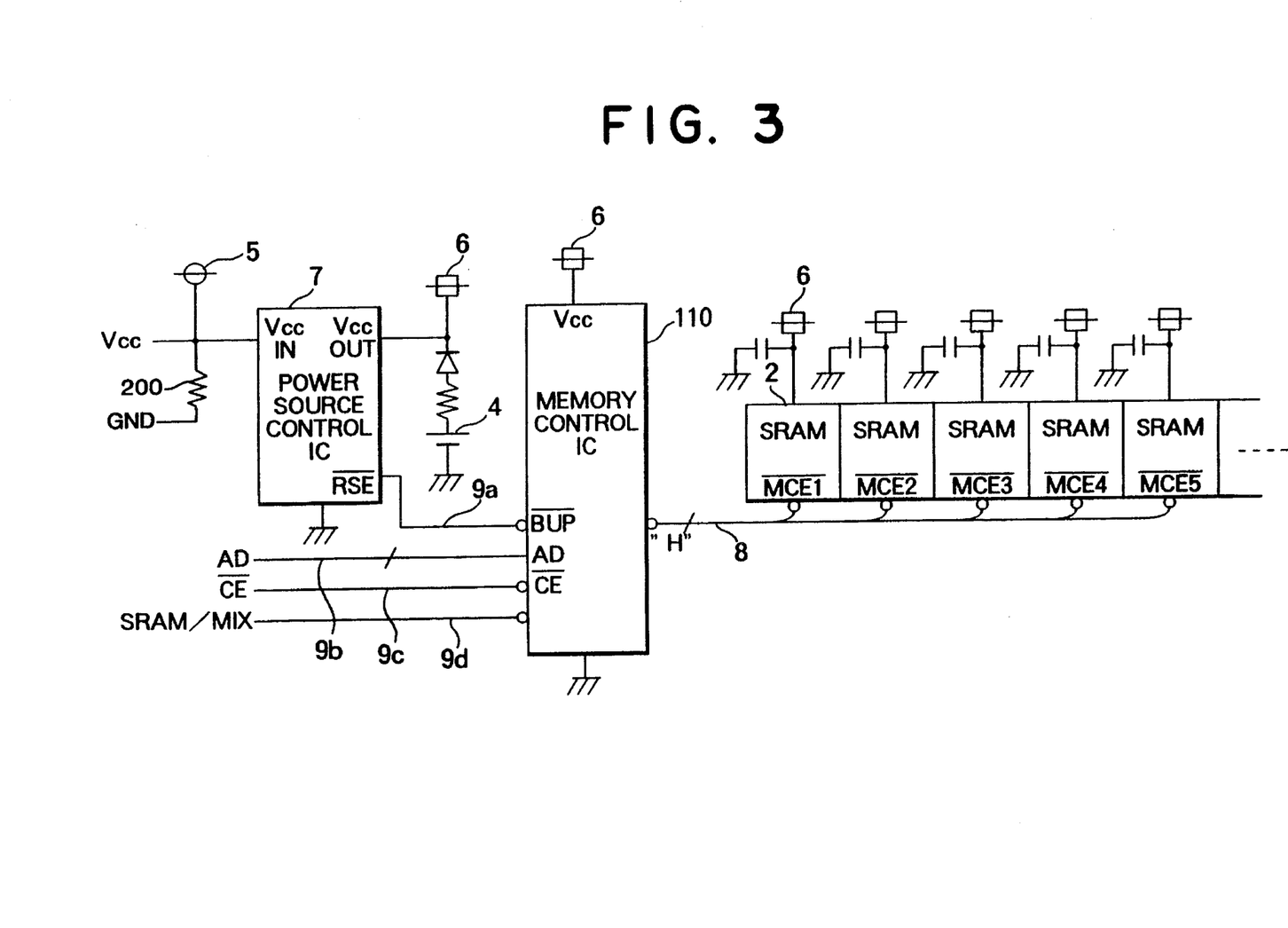
FIG. 3 is a schematic block diagram showing a relationship between the memory control circuit and the memory chip in a volatile memory card incorporating a memory control circuit for a memory card according to a second aspect of this invention.
Figure 4:
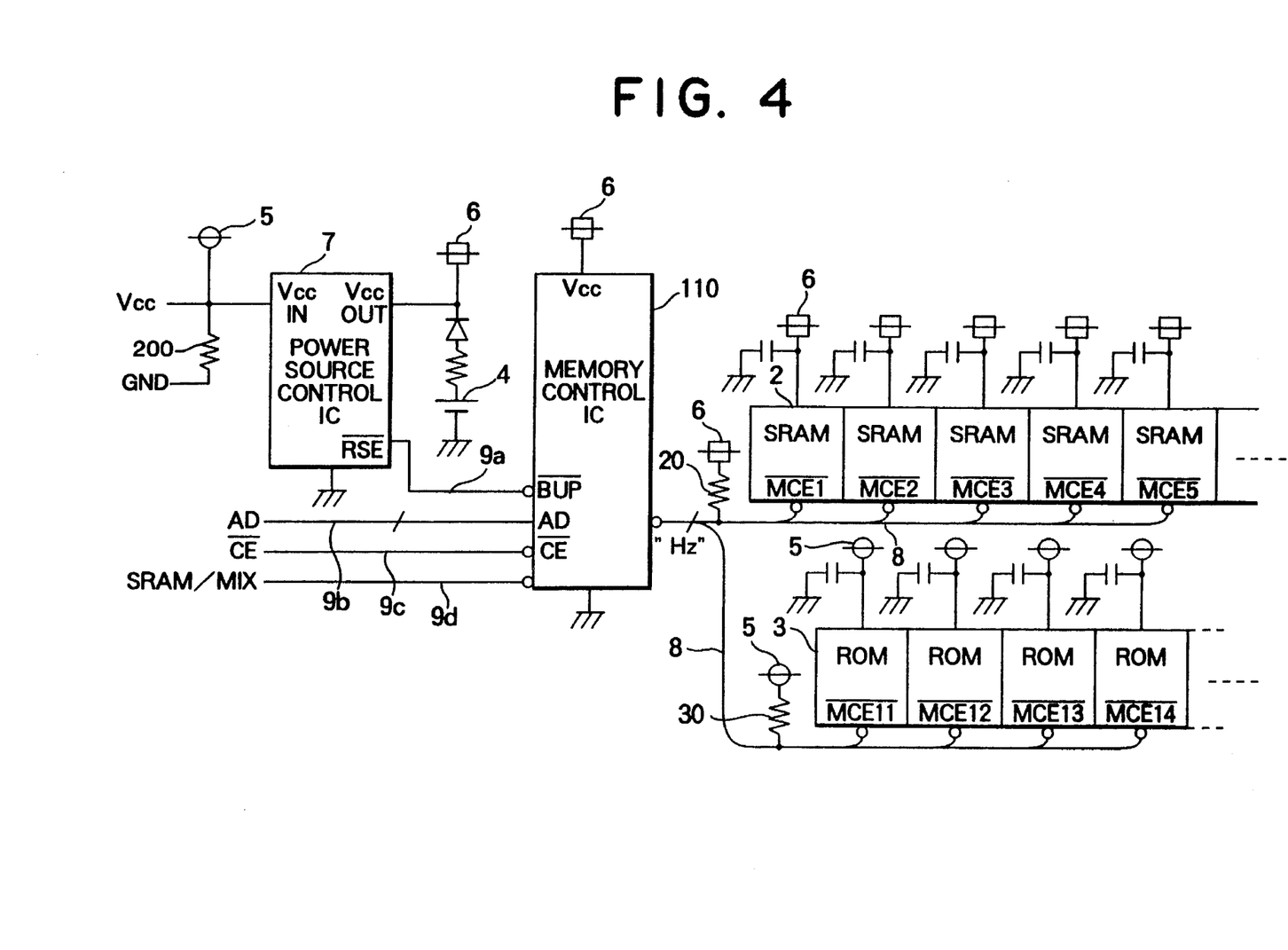
FIG. 4 is a schematic block diagram showing a relationship between a memory control circuit and a memory chip in a hybrid memory card incorporating a memory control circuit for a memory card according to a second embodiment of this invention.
Figure 5:
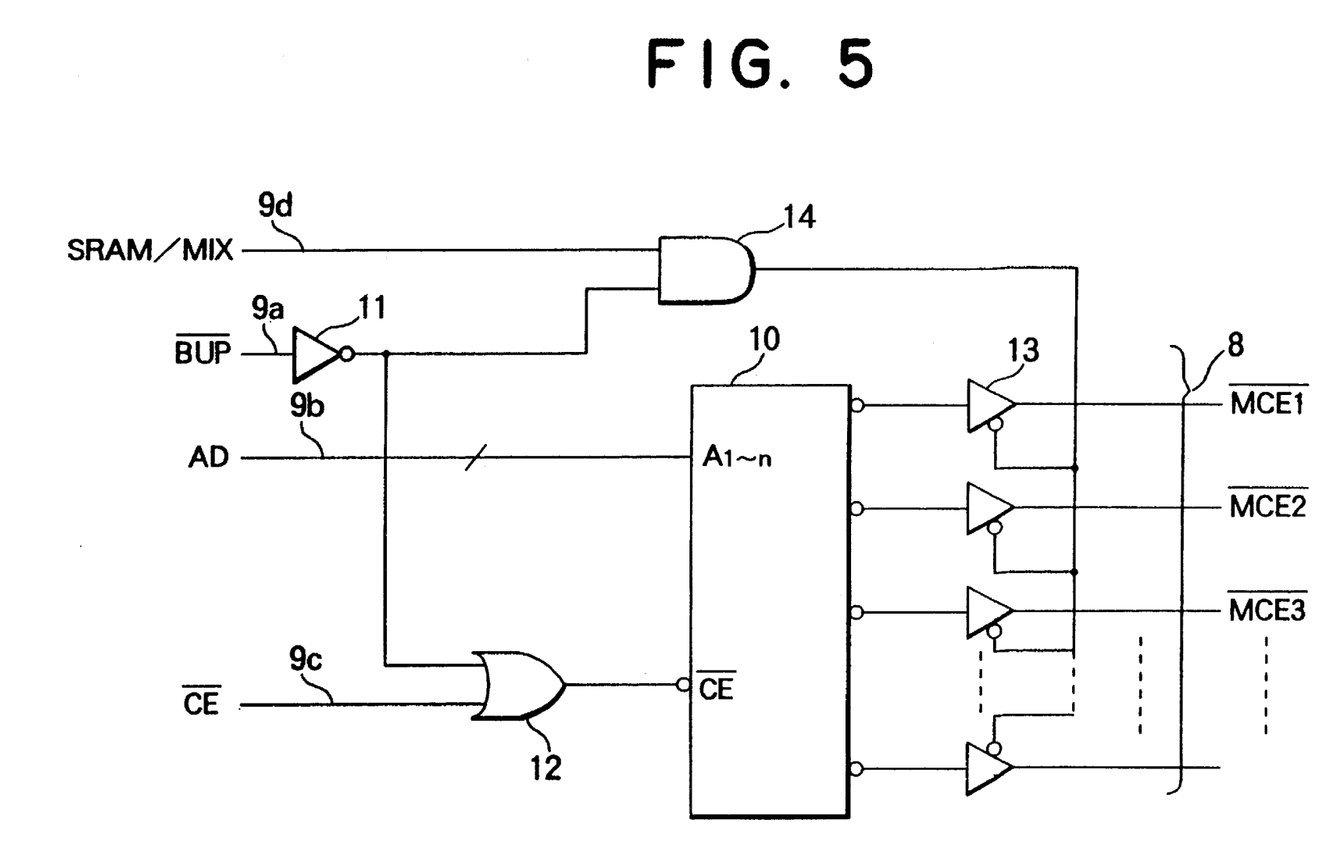
FIG. 5 is a block diagram showing a composition of portions for generating memory chip enable signals in the memory control circuit shown in FIGS. 3 and 4.

FIGS. 3, 4 and 5 show a memory control circuit for a memory card according to a second embodiment of the present invention. This circuit is compatible for both the volatile memory card and the hybrid memory card. FIG. 3 and FIG. 4 are block diagrams schematically showing a relationship between a memory control circuit and memory chips when used for the volatile memory card and for the hybrid memory card, respectively.

In the case of the volatile memory card shown in FIG. 3, a difference from the conventional one shown in FIG. 8 is that a memory control IC110 being compatible for both the volatile memory card and the hybrid memory card is mounted. Further, in the case of the memory card shown in FIG. 4, the portions other than those of the memory control IC 110 of this embodiment are the same as those of the first embodiment shown in FIG. 1. The difference between the memory control IC 100 of the first embodiment shown in FIG. 1 and that of this embodiment lies in that the latter has a newly added switching signal line 9d for switching between the volatile memory card and the hybrid memory card.

FIG. 5 is a block diagram showing an example of portions for generating the memory chip enable signals of the memory control IC 110 shown in FIGS. 3 and 4. The decoder 10, the inverter 11, the OR gate 12 and the tri-state buffer 13 are the same as those shown in FIG. 12 and operate in the same manner.

In this memory control IC 110, a switching signal (SRAM/MIX) representing the type of the memory card is used. The card is manufactured in such a manner that predetermined signals are supplied to the memory control IC 110 in accordance with the kind of the card. In this embodiment, the switching signals (SRAM/MIX) of "L" level and "H" level are provided respectively to the volatile memory card (SRAM card) and the hybrid memory card (MIX card). These switching signals (SRAM/MIX) and the backup signal ($\overline{BUP}$) inverted in the inverter 11 are supplied to the AND gate 14, the output signals of which are then input to the gate terminal of the tri-state buffer 13.

Namely, in the case of the hybrid memory card, since the switching signal (SRAM/MIX) is at a "H" level, the value of the backup signal ($\overline{BUP}$) to be input to the AND gate 14 through the inverter 11 is directly output from the AND gate 14. Accordingly, the operation would become the same as in the case of the hybrid memory card described in reference to FIGS. 1 and 2. Further, in the case of the volatile memory card, it is not necessary to set the memory chip enable signal to the high-impedance state ("Hz"). When the switching signal (SRAM/MIX) is at a "L" level, the output from the AND gate 14 is maintained at a "L" level such that the tri-state buffers 13 directly output the signals having been input thereto. The inverter 11, the OR gate 12, the tri-state buffer 13 and the AND gate 14 compose the backup time control means.

In operation, in the case of the volatile memory card shown in FIG. 3, the switching signal (SRAM/MIX) shown in FIG. 5 is at a "L" level. So, the output of the AND gate 14 is not switched to an "H" level and no "H" level signal is applied to the gate terminal of the tri-state buffer 13. As a result, the memory chip enable signal output from the decoder 10 is directly supplied to the SRAM chips 2 through the tri-state buffers 13. In the back-up state, the backup signal ($\overline{BUP}$) is at a "L" level. Therefore, in the backup state, the inverted signal thereof is supplied to one input of the OR gate 12, such that the chip enable terminal ($\overline{CE}$) of the decoder 10 is fixed at a "H" level to be disabled. In the disabled state of the decoder 10, all the memory chip enable signal output lines are switched to "H" level. Therefore, all the SRAM chips 2 are disabled by the setting of the memory chip enable terminals ($\overline{MCE1}, \overline{MCE2}, \ldots$) to "H" level, as well as being put in backup state because of being connected to the backup-type B power source 6.

On the other hand, in the case of the hybrid memory card shown in FIG. 4, the switching signal (SRAM/MIX) shown in FIG. 5 is turned into a "H" level. Accordingly, in the backup state, both the switching signal (SRAM/MIX) being the input signal to the AND gate 14 and the inverted signal of the backup signal ($\overline{BUP}$) are turned into "H" level, and a "H" level signal is applied to the gate terminal of the tri-state buffer 13. As a result, in the same manner as in the first embodiment, in the backup state the outputs from the tri-state buffer 13 are turned into the high-impedance state ("Hz"). Therefore, "H" level signals are supplied to the memory chip enable terminals ($\overline{MCE1}, \overline{MCE2}, \ldots$) of the SRAM chip 2 by the effect of the pull-up resistors 20 shown in FIG. 4, and the SRAM chips 2 are disabled and set to the backup state. The memory chip enable terminals ($\overline{MCE11}, \overline{MCE12}, \ldots$) of the ROM chips 3 are set to the "L" level by the effect of the pull-up resistors 30 connected to the non-backed-up power supply shown in FIG. 4 to prevent unnecessary current from flowing therethrough.

Figure 6:
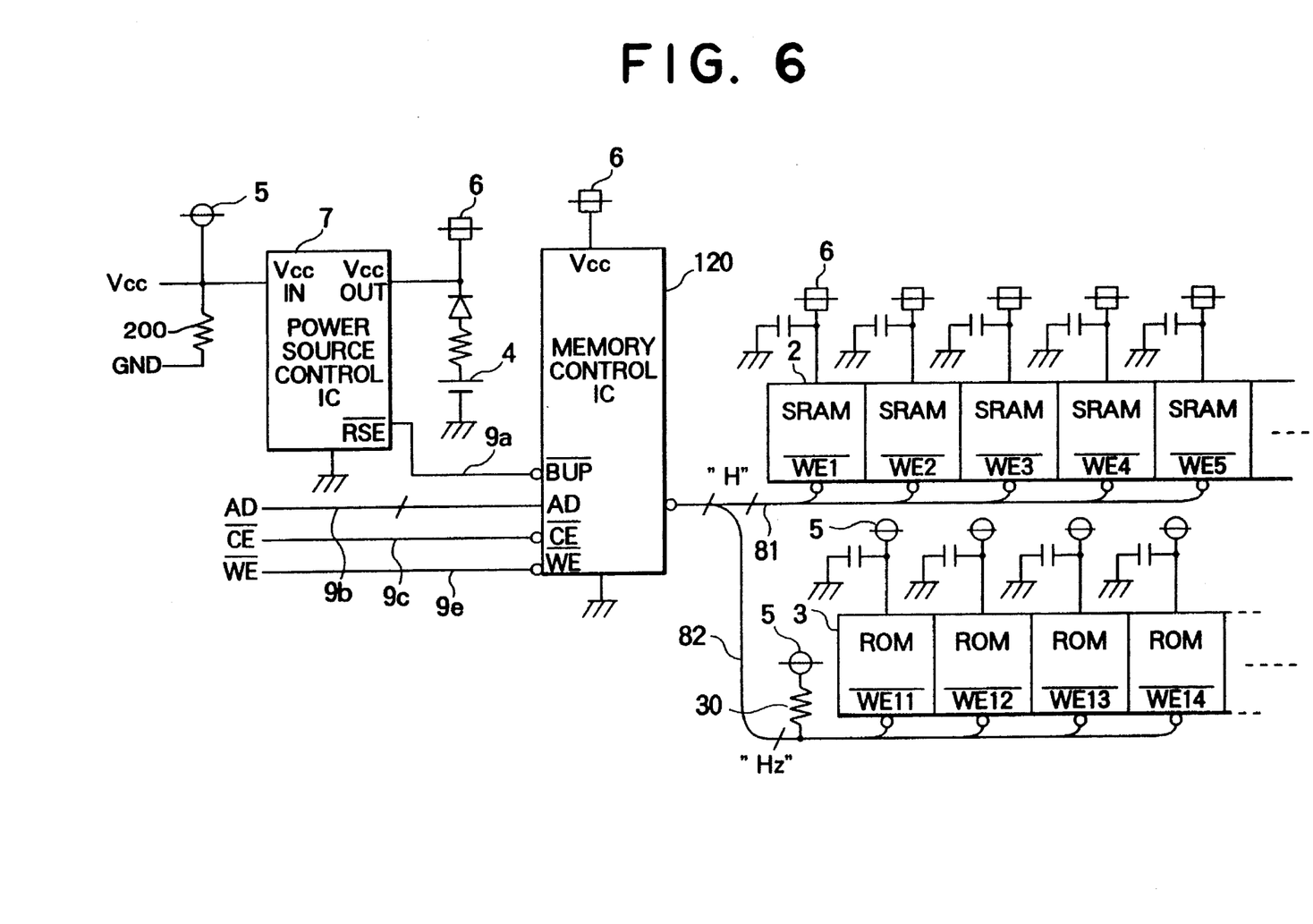
FIG. 6 is a schematic block diagram showing a relationship between a memory control circuit and a memory chip in a hybrid memory card incorporating a memory control circuit for a memory card according to the third aspect of this invention.
Figure 7:
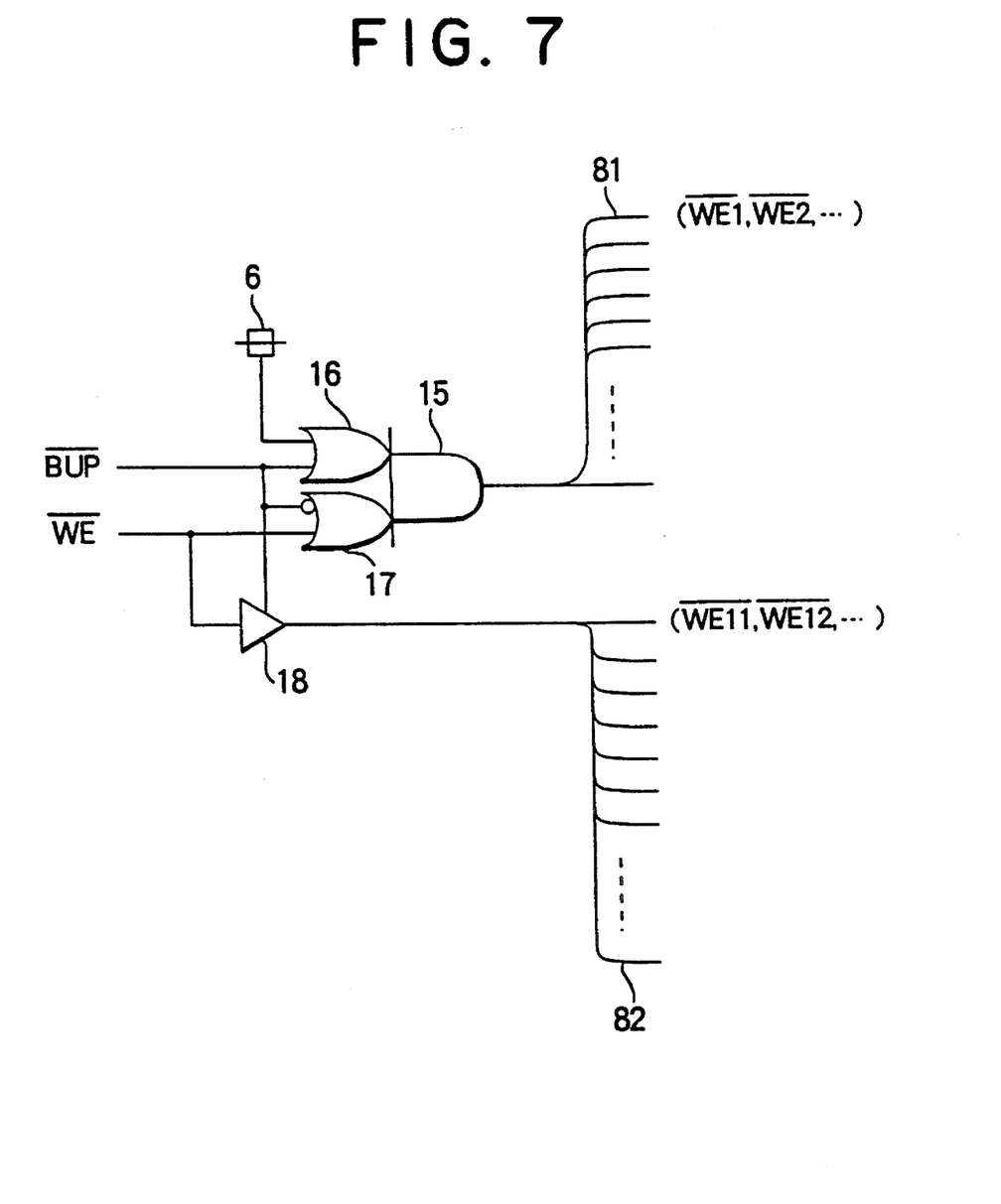
FIG. 7 is a block diagram showing a composition of portions for generating write enable signals in the memory control circuit shown in FIG. 6.

FIGS. 6 and 7 show a memory control circuit for a memory card according to a third embodiment of the present invention. The third embodiment relates to a memory control circuit for a memory card, compatible to be used for both the volatile memory card and the hybrid memory card, which is particularly characterized by its controlling operation of the write enable signals. FIG. 6 is a block diagram schematically showing a relationship between the memory control circuit and the memory chips in the case of using the memory control circuit for the hybrid memory card.

In FIG. 6, the numeral 120 designates a memory control IC capable of being used in common for both the volatile memory card and the hybrid memory card, and is particularly characterized in the controlling operation for the write enable signal ($\overline{WE}$). Therefore, write enable signal lines 9e are further illustrated as the input signal lines for the memory control circuit IC 120. These write enable signal lines 9e are not shown, though are practically provided also in the memory control IC in the aforementioned embodiments. The write enable signal output lines 81 are extended from the output side of the memory control IC 120 and connected to the write enable terminals ($\overline{WE1}, \overline{WE2}, \ldots$) of the SRAM chip 2. Further, write enable signals output lines 82 are connected to the write enable terminals ($\overline{WE11}, \overline{WE12}, \ldots$) of the ROM chip 3. The pull-up resistors 30 connected to the A power source 5 are coupled to the write enable signal output lines 82. The other portions are the same as in the aforementioned embodiments. In these embodiments, the ROM or EEPROM (Electrically Erasable Programmable) ROM chips 3 are write-enable non-volatile memory, and include e.g. OTP (one time programmable) ROM etc.

FIG. 7 is a block diagram showing an example of a composition of portions for generating write enable signals of the memory control IC 120 shown in FIG. 6. The backup-type B power source 6 and the backups signals ($\overline{BUP}$) are input to the OR gate 16. The inverted signal of the backup signal ($\overline{BUP}$) and the write enable signal ($\overline{WE}$) are input to the OR gate 17. The outputs from both these OR gates 16 and 17 are supplied to the AND gate 15. The output from the AND gate is divided into branches to become write enable signal output lines 81 connected to the write enable terminals ($\overline{WE1}, \overline{WE2}, \ldots$) of the SRAM chips 2. On the other hand, the write enable signal ($\overline{WE}$) and the backup signal ($\overline{BUP}$) are connected respectively to the input and the gate terminal of the tri-state buffers 18. The output from the tri-state buffer is divided into branches to become write enable signal output lines 82 connected to the write enable terminals ($\overline{WE11}, \overline{WE12}, \ldots$) of the ROM chips 3.

For the SRAM chip 2, the write enable terminals ($\overline{WE1}$, $\overline{WE2}$, ...) should be turned into an "H" level to be disabled. On the other hand, since no backup is needed for the ROM chip 3, it is desirable to eliminate unnecessary power consumption due to excessive current flow. Therefore, in this memory control IC 120, the write enable signal output lines are classified into two systems, the outputs in the backup state are set to "H" level and high-impedance state ("Hz").

In operation, when the card is not in the backup state in FIG. 7, the backups signal ($\overline{BUP}$) is at a "H" level, so the outputs from the AND gate 15 and the tri-state buffer 18 are both accorded with the values of the write enable signals ($\overline{WE}$). As a result, signals of the same value as that of the write enable signals ($\overline{WE}$) are supplied to the SRAM chip 2 and the ROM chip 3 (FIG. 6).

Meanwhile, in the backup state, the backup signal ($\overline{BUP}$) is at a "L" level. At this time, the upper input (i.e. the B power source 6 and the inverted signal of the backup signal) of the OR gates 16 and 17 are at a "H" level such that the output signal of the AND gate 15 is fixed to a "H" level. Further, a "L" level backup signal ($\overline{BUP}$) is input to the gate terminal of the tri-state buffer 18, such that the output signal of the tri-state buffer 18 is fixed to the high impedance state ("Hz"). Accordingly, signals of "H" level are supplied to the write enable terminals ($\overline{WE1}$, $\overline{WE2}$, ...) of the SRAM chips 2 (see FIG. 6). Further, the write enable signal output lines 82 connected to the write enable terminals ($\overline{WE11}$, $\overline{WE12}$, ...) of the ROM chips 3 are in the high-impedance state ("Hz"), but are turned into "L" level by the pull-up resistors 30 connected to the A power source 5 without backup. The SRAM chips are then turned into the backup state so that no unnecessary currents flow through the ROM chips 3.

Although the case of the hybrid memory card has been described with reference to FIG. 6, if it is desired to use the memory control IC 120 of this embodiment for the volatile memory card, only the side of the memory chip enable signal output lines 81 of the memory control IC may be used. Namely, in the memory control IC 120 in this embodiment, it may be selected which of the output lines 81 or 82 is connected depending on whether the memory chip is volatile or non-volatile.

The SRAM chips and the ROM chips to be mounted on the memory card in the aforementioned embodiments are disclosed as example of the volatile memory and the non-volatile memory respectively, although any types other than those described can also be used.

As mentioned above, in the memory control circuit for the hybrid memory card according to the first embodiment of the present invention, in the backup state, all the memory chip enable signal output lines of the decoder are turned into the high-impedance state by the backup time control means, and the volatile memory chip is disabled by connecting the pull-up resistor of the backed up power supply or the pull-up resistor of the non-backed-up power supply to the memory chip enable signal output lines, so that no unnecessary current flows through the non-volatile memory chip. As a result, any excessive power consumption in the non-volatile memory chip in the backup state can be reduced, and the life of the built-in-battery for data backup can be expanded, and further the reliability of the card is enhanced.

Further, in the memory control circuit according to the second embodiment of the present invention, the memory chip enable signals to be supplied to the memory chips in the backup state are switched depending on whether the volatile memory card or the hybrid memory card is used. As a result, it is possible to provide a memory control circuit capable of being used for both the volatile memory card and the hybrid memory card for reducing any excessive power consumption in the non-volatile memory chip in the data backup state.

Furthermore, in the memory control circuit for controlling the write enable signal according to the third embodiment of the present invention, the write enable signal output lines for the volatile memory chip and the non-volatile memory chip are separately provided and connected depending on the type of the memory chip. Therefore, it can be used for both the volatile memory card and the hybrid memory card, thereby increasing the versatility. In addition, the write enable signal output lines to be connected to the non-volatile memory chips are coupled to the A power source without backup, thereby reducing the power consumption in the non-volatile memory chip in the backups state in the same manner as in the aforementioned embodiment.

What is claimed is:

1. A memory control circuit for a memory card having an A power source connected to an external power source and a B power source connected to a built-in-battery for memory backup, said memory card being a hybrid memory card including at least one non-volatile memory chip connected to the A power source and at least one volatile memory chip connected to said B power source mounted thereon, said memory control circuit comprising:

a decoder having, at the input side, an address signal bus, a chip enable signal line for controlling the driving of said decoder, and a backup signal indicating a data backup state of the memory card, and at the output side a plurality of memory chip enable signal output lines connected respectively to the memory chips, and selectively generating memory chip enable signals for enabling the memory chips to said plurality of memory chip enable signal output lines in accordance with the address signal during the enable state due to control of the chip enable signal;

a backup time control means for compulsorily disabling the chip enable signal and turning all the memory chip enable signal output lines of said decoder into a high-impedance state, when the backup signal indicates a backup state, said backup time control means includes an OR gate for gating the chip enable signal by the backup signal, and tri-state buffers provided on the memory chip enable signal output lines of said decoder respectively and being controlled by the backup signals;

pull-up resistors connecting the memory chip enable signal output lines to one of the B power supply and the non-backed-up A power supply respectively, for disabling the memory chip enable signal output lines for the volatile memory chips and setting the memory chip enable signal output lines for the non-volatile memory chips to such a state as preventing the current from flowing through the non-volatile memory chips, when said memory chip enable signal output lines are in high-impedance state.

2. A memory control circuit including an A power source connected to an external power source and a B power source connected to a built-in-battery for memory backup, said memory control circuit capable of being used for both a volatile memory card having at least one volatile memory chip connected to the B power source and a hybrid memory card having at least one non-volatile memory chip connected to the A power source and at least one volatile memory chip connected to the B power source, said memory control circuit comprising:

a decoder having, at the input side, an address signal bus, a chip enable signal line for controlling the driving of said decoder, and a backup signal line indicating a data backup state of the memory card, and at the output side, a plurality of memory chip enable signal output lines connected respectively to the memory chips, said decoder selectively generating memory chip enable signals for enabling the memory chips to said plurality of memory chip enable signal output lines in accordance with the address signal during the enable state, and generating signals for disabling the non-volatile memory chip to all the memory chip enable signal output lines during the disabled state;

a switching signal line for indicating whether the memory card is a volatile memory card or a non-volatile memory card;

a backup time control means for compulsorily disabling the chip enable signal when the backup signal indicates a backup state, and directly supplying the signals on the memory chip enable signal output lines of said decoder to the memory chips when the switching signal indicates volatile memory card use, while turning all the memory chip enable signal output lines of said decoder into a high-impedance state when the switching signal indicates hybrid memory card use;

pull-up resistors connecting the memory chip enable signal output lines to one of the B power supply and the non-backed-up A power supply respectively, for disabling the memory chip enable signal output lines to the volatile memory chips and setting the memory chip enable signal output lines to the non-volatile memory chips to such a state as preventing the current from flowing through the non-volatile memory chips, when the memory card is a hybrid memory card and said memory chip enable signal output lines are in high-impedance state.

3. A memory control circuit according to claim 2 wherein said backup time control means comprises:

an OR gate for gating the chip enable signals by the backup signals;

an AND gate for gating the backup signal by the switching signals; and tri-state buffers provided on the memory chip enable signal output lines of said decoder and being controlled by the output from said AND gate.

4. A memory control circuit including an A power source connected to an external power source and a B power source connected to a built-in-battery for memory backup, said memory control circuit capable of being used for both a volatile memory card having at least one volatile memory chip connected to the B power source and a hybrid memory card having at least one non-volatile memory chip connected to the A power source and at least one volatile memory chip connected to the B power source, said memory control circuit comprising:

a main circuit having, at the input side, a write enable signal line and a backup signal line for indicating that the memory card is in the backup state, and at the output side, a plurality of write enable signal output lines being connected respectively to the memory chips, said main circuit supplying write enabling signals to the write enable signal output lines in accordance with the input write enable signals when the backup signal indicates that the card is in the operating state, while setting at least one of the write enable signal output lines to have a value for write-disabling the memory chip and the remained ones to a high-impedance state when the backup signal indicates a backup state; and pull-up resistors, being connected respectively to the write enable signal output lines which are set to a high-impedance state during the backup state, for connecting the write enable signal output lines to the non-backed-up A power supply.

* * * * *